United States Patent [19]

Labadie et al.

[11] Patent Number: 5,206,117

[45] Date of Patent: Apr. 27, 1993

[54] PHOTOSENSITIVE POLYAMIC ALKYL ESTER COMPOSITION AND PROCESS FOR ITS USE

[76] Inventors: Jeffrey W. Labadie, 1618 Kamsack Dr., Sunnyvale, Calif. 94087; Dennis R. McKean, 10677 Amulet Pl., Cupertino, Calif. 95014; Willi Volksen, 372 El Portal Way, San Jose, Calif. 95123; Gregory M. Wallraff, 16925 Del Monte Ave., Morgan Hill, Calif. 95037

[21] Appl. No.: 850,623

[22] Filed: Mar. 13, 1992

Related U.S. Application Data

[63] Continuation-in-part of Ser. No. 745,575, Aug. 14, 1991, abandoned.

[51] Int. Cl.$^5$ .......................... G03F 7/32; G03F 7/038
[52] U.S. Cl. ..................................... 430/325; 430/270; 430/330; 430/906; 430/908; 430/919
[58] Field of Search ............... 430/325, 270, 283, 330, 430/906, 908, 919

[56] References Cited

U.S. PATENT DOCUMENTS

| | | | |
|---|---|---|---|
| 2,880,230 | 3/1959 | Edwards et al. | 260/475 |
| 3,179,630 | 4/1965 | Endrey et al. | 260/78 |
| 3,179,631 | 4/1965 | Endrey et al. | 260/78 |
| 3,179,632 | 4/1965 | Hendrix et al. | 260/78 |
| 3,179,633 | 4/1965 | Endrey et al. | 260/78 |
| 3,261,811 | 7/1966 | Tatum | 260/47 |
| 3,282,898 | 11/1966 | Angelo et al. | 260/47 |
| 3,316,212 | 4/1967 | Angelo et al. | 260/47 |
| 3,376,260 | 4/1968 | Fritz | 528/188 |
| 3,423,366 | 1/1969 | De Brunner et al. | 260/65 |
| 3,518,219 | 6/1970 | Lavin et al. | 260/33.4 |
| 4,218,555 | 8/1980 | Antonoplos et al. | 528/126 |
| 4,242,437 | 12/1980 | Rohloff | 430/270 |
| 4,252,707 | 2/1981 | Ruid | 260/30.2 |
| 4,451,551 | 5/1984 | Kataoka et al. | 430/270 |
| 4,847,359 | 7/1989 | Pfeifer et al. | 430/283 |
| 4,849,501 | 7/1989 | Diller et al. | 528/353 |
| 4,898,806 | 2/1990 | Pfeifer | 430/325 |

FOREIGN PATENT DOCUMENTS

425142A2  5/1991  European Pat. Off. .

OTHER PUBLICATIONS

Rohde et al. "Recent Advances in Photoimagable Polyimides" SPIE vol. 539 Advances in Resist Technology and Processing II (1985) pp. 175–180.

Koton et al., "Investigation of the Kinetics of Chemical Imidization", Polymer Science U. S. S. R., vol. 24, No. 4, p. 800, 1982.

Rubner et al., "A Photopolymer—The Direct Way to Polyimide Patterns", Photographic Science and Engineering, vol. 23, No. 5, Sep./Oct. 1979, pp. 303–309.

Pottiger, "Second Generation Photosensitive Polyimide Systems", Solid State Technology/Dec. 1989, pp. S1–S4.

Moore et al., "An Intrinsically Photosensitive Polyimide", Chemistry of Materials, 1 163 (1988).

Omote et al., "Fluorine-Containing Photoreactive Polyimide: 4. The Dependency of the Content of Pendant O-Naphthoquinonediazide on the Mechanism of Photochemical Reaction in a Novel Photoreactive Polyimide", Polymer Communications, 1990, vol. 31, Apr., pp. 134–136.

Omote et al., "Fluorine-Containing Photoreactive Polyimide 5: A Novel Positive-Type Polyimide Based on Photoinducted Acidolysis", Journal of Polymer Science: Part C: Polymer Letter, vol. 28, pp. 59–64 (1990).

"Photosensitive Polyimides", Ube Industries, Ltd., Jpn. Kokai Tokkyo Koho JP 59,108,031 [84,108,031], Jun. 22, 1984, 10 pages.

(List continued on next page.)

Primary Examiner—Marion E. McCamish
Assistant Examiner—Janis L. Dote
Attorney, Agent, or Firm—Robert B. Martin

[57] ABSTRACT

The present invention relates to photosensitive negative and positive tone compositions for imagewise deposition of polyimide on a substrate.

3 Claims, No Drawings

OTHER PUBLICATIONS

Chemical Abstract 102: 7616p (Issue 1, 1985).
"Photosensitive Polyimides Soluble in Organic Solvents", Ube Industries Ltd., Jpn. Kokai Tokkyo Koho JP 60 06,729 [85 06,729], Jan. 14, 1985, 6 pages.
Chemical Abstract 102: 221347v (Issue 13, 1985).
"Organic-Solvent-Soluble Photosensitive Poly Amide-Imides", Ube Industries, Ltd. Jpn. Kokai Tokkyo Koho JP 60 06,728 [85 06,728], Jan. 14, 1985, 8 pages.
Chemical Abstract 102: 221607e (Issue 13, 1985).
Vinogradova et al., "Chemical Cyclization of Poly (Amido-Acids) in Solution Vysokomol. Soyed A16 No. 3, 506", 1974.
Bessonov et al., "Polyimides Thermally Stable Polymers", Consultants Bureau Publishers, 1987, p. 76.
Craig, "Polyimide Coatings", E. I. DuPont de Nemours & Company, Inc., Electronic Materials Handbook, vol. 1: Packaging, ASM International, 1989.
Yoda et al., "New Photosensitive High Temperature Polymers for Electronic Applications", J. Macromol. Sci.-Chem., A21 (13&14), pp. 1641-1663 (1984).
Pfeifer et al., "Direct Photoimaging of Fully Imidized Solvent-Soluble Polyimides", Central Research Laboratories and Plastics and Additives Division, Product Development, Ciba-Geigy Ltd., CH-4002 Basle/-Switzerland.
Recent Advances in Polyimide Sci & Tech. Ed. Weber et al. (1987) NY p. 336.

PHOTOSENSITIVE POLYAMIC ALKYL ESTER COMPOSITION AND PROCESS FOR ITS USE

CROSS REFERENCE TO RELATED APPLICATION

This is a continuation-in-part application of copending application Ser. No. 07/745,575 filed Aug. 14, 1991 now abandoned.

FIELD OF THE INVENTION

The present invention relates to photosensitive negative and positive tone compositions for imagewise deposition of polyimide on a substrate. The compositions are useful as a dielectric insulating material in forming integrated circuits.

BACKGROUND OF THE INVENTION

Polyimides are known in the art for use in the manufacture of integrated circuits including chips (e.g. chip back end of line), thin film packages and printed circuit boards. Polyimides are useful in forming dielectric interlayers, passivation layers, alpha particle barriers and stress buffers. Photosensitive polyimides are particularly useful as an interlayer dielectric material to insulate the conductor wiring interconnecting the chips on a multichip module. This is known as thin-film wiring. A multichip module s an intermediate level of packaging between the chips and the circuit board. Multichip modules are generally known in the art. Multichip modules are made up of multiple layers of power, signal and ground planes which deliver power to the chips and distribute the input/output signals between chips on the module or to/from the circuit board.

Photosensitive polyimides can also be used as the dielectric material for insulating the conductor wiring on a silicon carrier as a multichip module. The use of photosensitive polyimide provides a simplified method for the fabrication of the patterned polyimide required for these thin film wiring schemes. It is important that the final properties of the patterned polyimide are not significantly altered relative to the nonphotosensitive polyimides also used in forming the multichip module.

Photosensitive polyimides useful as a dielectric interlayer for conductor wiring in a multichip module are known in the art. "Polyimide Coatings" by Craig, Electronic Materials Handbook, Vol. 1, discloses negative tone photosensitive polyamic acid esters where the ester moiety is covalently bound to the polymer backbone and contains unsaturated linkages in the form of acrylates or methacrylates. Upon exposure to light, these groups, in conjunction with a suitable photopackage (photoinitiator and sensitizer), crosslink via a free radical mechanism resulting in differential solubility between the exposed and unexposed regions. Subsequent development with a suitable solvent system followed by an appropriate cure results in a negative tone imaged polyimide dielectric interlayer. However, during the cure, the components of the photopackage in the unexposed area are volatilized resulting in excessive shrinkage of the polyimide interlayer.

Yoda et al., "New Photosensitive High Temperature Polymers for Electronic Applications," J. Macromol. Sci.-Chem., A21(13&14), 1641 (1984), discloses a similar approach which involves incorporating an ammonium salt as a photosensitive group. The ammonium salt is formed from the reaction of a suitable poly(amic acid) with a tertiary amine having unsaturated groups in the form of acrylates or methacrylates. However, again the components of the photopackage in the unexposed area are volatilized during the cure of the polyimide generally resulting in excessive shrinkage of the polyimide film.

J. Pfeiffer et al., "Direct Photoimaging of Fully Imidized Solvent-Soluble Polyimides," Proc. Second Intern. Conference on Polyimides, Ellenville, N.Y. (1985), discloses a photosensitive polyimide based on fully imidized polyimide having groups which crosslink upon exposure to light. Upon exposure to light, the crosslinking reaction introduces differential solubility in the polyimide film which can then be developed with organic solvents. Although fully imidized photosensitive polyimide systems have less shrinkage of the developed pattern, they do experience shortcomings in the area of thermal stability, mechanical properties and solvent induced stress-cracking due to the soluble nature of the polyimides. There still is a need in the art for a suitable photosensitive polyimide system for use in making integrated circuits.

It is, therefore, an object of the present invention to provide photosensitive polyimide system for use in making integrated circuits.

Other objects and advantages will become apparent from the following disclosure.

SUMMARY OF THE INVENTION

The present invention relates to a photosensitive negative tone composition comprising a polyamic alkyl ester and a photosensitive base generator. Upon imagewise exposure to light, the photosensitive base generator in the exposed areas generates free base which catalyzes the imidization of the polyamic alkyl ester to an insoluble, partially imidized polyimide. The negative tone composition can then be developed based on differential solubility by art known techniques as for example with a suitable solvent or solvent mixture.

The present invention also relates to a photosensitive positive tone composition comprising a polyamic alkyl ester, an base or base precursor and a photosensitive acid generator. Upon exposure to light, the photosensitive acid generator in the positive tone composition generates acid which scavenges the base in the exposed area of film. The subsequent heating of the positive tone composition to a low temperature causes base catalyzed partial imidization of the unexposed areas of the film. The positive tone composition can then be developed by art known techniques as for example with a suitable solvent.

After development, the negative and positive tone images can be heated to an elevated temperature to fully imidize the polyimide images.

The present invention also relates to processes for generating negative and positive tone images using the compositions of the present invention and to integrated circuits formed using these processes.

A more thorough disclosure of the present invention is presented in the detail description which follows.

DETAILED DESCRIPTION OF THE INVENTION

The present invention relates to a negative tone composition comprising a polyamic alkyl ester and a photosensitive base generator preferably a photosensitive amine generator. The present invention also relates to a positive tone composition comprising a polyamic alkyl ester, a photosensitive acid generator and an base source selected from a thermally activated base or thermally generated base.

Upon exposure to light, the photosensitive base generator in the negative tone composition generates free base which catalyzes the imidization of the polyamic alkyl ester to an insoluble partially imidized (10-70%) polyimide. Optionally, after exposure of the composition, it can be heated to a low temperture to further accelerate the base catalyzed imidization in the exposed areas and thereby enable a more effective development. The negative tone composition can then be developed by art known techniques as for example with suitable polar solvents such as a polar aprotic solvent.

Upon exposure to light, the photosensitive acid generator in the positive tone composition generates free acid which scavenges base in the exposed area of the film. The subsequent heating of the positive tone composition at a low temperature causes activation/generation of the base and base catalyzed imidization of the unexposed areas of the film. The positive tone compositions can also be developed by art known techniques as for example with suitable polar solvent such as a polar aprotic solvent.

An alternative embodiment of the positive tone composition of the present invention comprises polyamic alkyl ester, a photosensitive base generator and a photosensitive acid generator. The base generator and acid generator are selected so that they are photosensitive at different light frequencies. The process for forming a positive ton image involves blanket exposure at a first frequency to generate a free base, imagewise exposure at a second frequency to generate a free acid and then development with a suitable solvent. Alternatively, the process can involve imagewise exposure at a first frequency to generate free acid, blanket exposure at a second frequency to generate a free base and then development. This second procedure is preferred for active bases and active polyamic alkyl esters. Optionally, both process will include a post exposure heating step to enhance the development.

The present invention also relates to the process for generating negative and positive tone images of polyimide on a substrate. The process for generating a negative tone image of polyimide on a substrate comprises the steps of: (a) coating the substrate with a film comprising polyamic alkyl ester and a photosensitive base generator which are conveniently dissolved in an organic solvent; (b) imagewise exposing the film to radiation; and (c) developing the image by art known techniques such as treating with solvent. This process will also preferably comprise a post exposure heating step to enhance development. The process for generating a positive tone image of polyimide on a substrate comprises the steps of (a) coating the substrate with a film comprising polyamic alkyl ester, a photosensitive acid generator and a thermal base generator or a thermally activated base; (b) imagewise exposing the film to radiation; (c) heating the film to a temperature of about 50° to about 250° C. to cause generation/activation of free base and base catalyzed imidization of the polyamic alkyl ester in the unexposed area of the film; (d) developing the image by art known techniques such as by treatment with a solvent.

In an alternative embodiment, the process of the present invention for generating a positive tone image comprises the steps of (a) coating the substrate with a film comprising polyamic alkyl ester, photosensitive acid generator and photosensitive base generator, (b) imagewise exposing the film to radiation at a first frequency to generate free acid, (c) blanket exposing the film to radiation at a second frequency (or broadband exposure) to generate free base and (d) developing the image by art known techniques. The order of steps (b) and (c) can, of course, be reversed. The process will also optionally comprise a post exposure bake step to enhance development.

The compositions of the present invention comprise a polyamic alkyl ester. The polyamic alkyl ester polymer has the following general repeat unit:

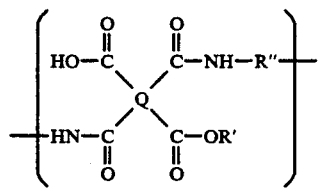

where R, R' and R" are each independently selected from, alkyl or aryl and optionally substituted with suitable substituents which do not interfere with the imidization nor the final properties of the polyimide. Generally R and R' are the same and are suitably lower alkyl or haloalkyl, such as methyl, ethyl, or 2,2,2-trifluoroethyl, alkyl glycolyl or the like. A suitable R" is selected from, alkyl or aryl and optionally substituted with suitable substituents which do not interfere with the imidization nor final properties of the polyimide. Suitable R" groups generally comprise a monocyclic or polycyclic divalent aromatic radical in which the aromatic rings may be aromatic, heterocyclic, or directly attached rings, e.g., biphenylene and naphthalene. Suitable R" may be selected from

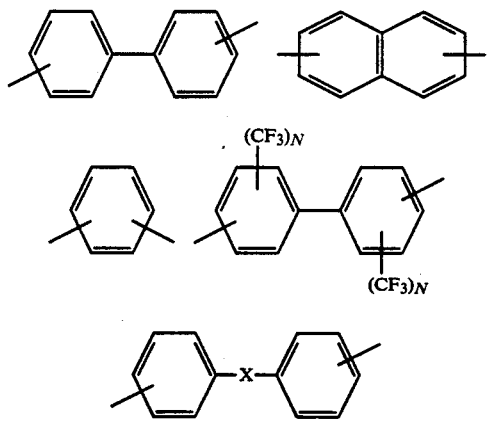

wherein X is selected from the group consisting of an alkylene chain having 1-3 carbon or halocarbon atoms, carbonyl, —O—, —S—, —SO$_2$— and —N— alkyl. The aromatic radical can optionally be substituted by a variety of substituents such as alkyl, haloalkyl (trifluoromethyl) halo or the like. Suitable R" include:

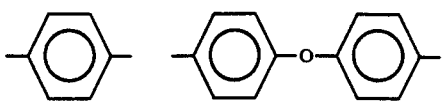

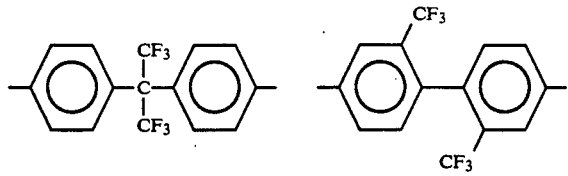

Suitable Q groups generally comprise tetravalent organic radicals selected from cycloalkyl, aromatic and aromatic heterocyclic wherein the aromatic generally has at least 6 carbon atoms characterized by benzenoid unsaturation and the four valencies are fixed by pairs on separate adjacent carbon atoms. When the aromatic radical comprises several rings connected together, the linking elements are for example a single bond or one of the following atoms or groups:

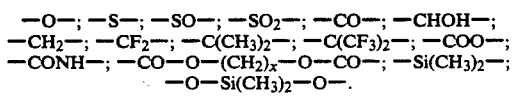

Suitable Q groups include the following:

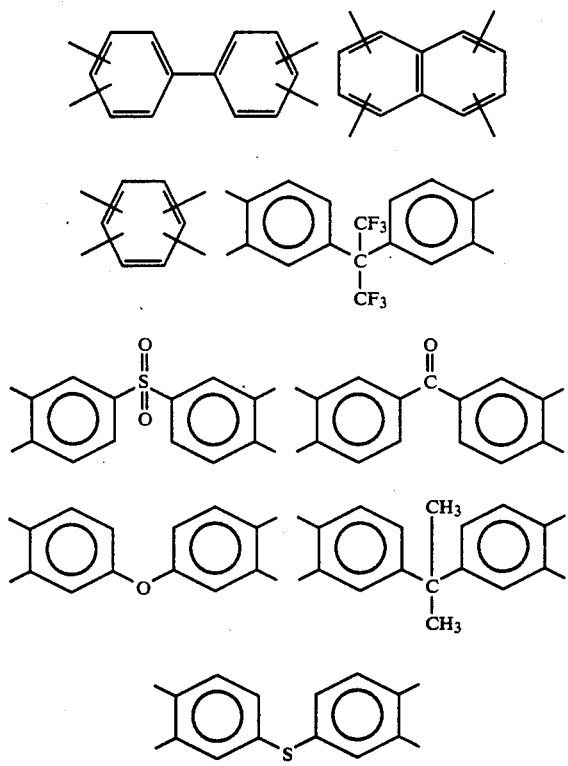

Other suitable Q groups will be known to those skilled in the art. Q may also be substituted with a variety of substituents known to those skilled in the art which do not interfere with the imidization nor the final properties of the polyimide. Copolymers of polyamic esters and partially imidized polyamic esters (e.g. prepared by controlled thermal imidization) may also be used in the process of the present invention.

The nature of Q and R" may impact the absorption of the radiation by the film and also the properties of the polyimide film. Generally, it is desired that the ester transmit light in the 250–500 nm range and form a polyimide with a rigid backbone to resist swelling and cracking during development. Suitable Q and R" groups to obtain such properties are disclosed above and those skilled in the art will know other suitable Q and R" groups to obtain these properties. Suitable polyamic alkyl esters will have a molecular weight of about 5000 to about 100,000, preferably about 10,000 to about 50,000. The polyamic alkyl esters will generally comprise about 80 weight % to about 99 weight % of the composition of the present invention.

The composition is generally coated onto a substrate as a thin film by dissolving the composition in a suitable organic solvent. Suitable organic solvents for the composition include N-methylpyrrolidone ("NMP"), gamma butyrolactone and dimethylacetamide. Other suitable organic solvents will be known to those skilled in the art. The solution will generally comprise about 5 to 50 weight % of the composition. Polyamic alkyl esters used in the present invention are readily prepared by art known techniques such as those disclosed in Volksen et al. "Polyamic Alkyl Esters: Versatile Polyimide precursors for Improved Dielectric Coatings" 41st Electronic Components and Technology Conference Proceedings p. 572 (May 1991) the disclosure of which is incorporated herein by reference. Examples of polyimides made by the process of the present invention include poly(p-phenylene biphenyltetracarboximide), poly [bis (trifluoromethyl biphenylene) pyromellitimide], poly [bis trifluoromethyl biphenylene) biphenyltetracarboximide], poly (oxydiphenylene biphenyl tetracarboximide) and poly (p-phenylene oxydiphthalimide), poly(hexafluoroisopropyldene diphenylene biphenyl tetracarboximide) and copolymers thereof.

Suitable bases for catalyzing the imidization are amines and Bronsted bases. Suitable Bronsted base anions include hydroxide, fluoride and carboxylate anions. Suitable photosensitive Bronsted bases include 4,4'-bis(-dimethylamino) triphenylmethane leucohydroxide, fluoride or cyanide and metal complexes such as chromium/cobalt (triamino) fluoride. Other suitable photosensitive Bronsted bases will be known to those skilled in the art. Amines suitable for catalyzing the imidization are (i) straight chain or cyclic alkyl amines (ii) diamines and (iii) multifunctional amines. Preferably, the amine will be relatively non-volatile such as cyclohexylamine, methylene dicyclohexylamine or a higher molecular weight amine such as dodecylamines. Aromatic and sterically hindered amines may not sufficiently catalyze the imidization reaction to enable the reaction to proceed at a satisfactory rate at ambient temperature.

Suitable photosensitive amine generators include benzyl carbamates (e.g. amines protected by a benzyloxycarbonyl substituent) benzyl sulfonamides, benzyl quaternary ammonium salts, imines, iminium salts and cobalt-amine complexes. Other photosensitive amine generators suitable for use in the present inventions will be known to those skilled in the art such as those disclosed in "Base Catalysis in Imaging Materials", by J. Frechet et al. J. Org. Chem. 1990, 55, 5919; "Acid Hardening Positive Photoresist Using Photochemical Generation of Base" by Winkle et al. J. of Photopolymer Sci. and Tech. 3, 1990, 419, and "Synthetic Organic Photochemistry" by Horspool, Plenum Press 198—the disclosures of which are incorporated herein by reference. Conveniently, the photosensitive amine generator will absorb light in the 250–500 nm region to generate the amines described above.

Suitable thermal base generators for use in the present invention are bases which have a thermally removable protecting group. Heating the base to an elevated temperature of about 75° to about 150° releases the free base which can then catalyze the imidization reaction. Suitable thermal base generators include t-butyl carbamates and organic quarternary ammonium salts. Other thermal base generators will be known to those skilled in the art.

Suitable thermally activated bases for use in the present invention included sterically hindered tertiary amines and aromatic amines. These amines generally only catalyze the imidization of the polyamic acid ester significantly when the temperature has been raised from ambient to an elevated temperature of about 75° to about 200° C. Suitable thermally activated amines include aniline, diethyl-t-butyl amine and diisopropyl ethyl amine. Other suitable thermally activated bases will be known to those skilled in the art.

Photosensitive acid generators for use in the present invention include triphenyl sulfonium hexafluoroantiminoate, nitrobenzyl tosylate, methanesulfonate esters of hydroxybenzophenones, diaryliodonium salts, diphenyl-4-thiophenoxyphenylsulfonium salts, 2,4,6 (trichloromethyl) triazine and tris (2,3-dibromopropyl) isocyanurate. Other acid generators will be known to those skilled in the art. Preferably, the photosensitive acid generator will absorb light in the 250-400 nm region of the spectrum. The absorption by the acid generator is conveniently correlated with the frequency of transmission of light through the ester.

The composition of the present invention may also include a photosensitizer. Photosensitizer enables the absorption of radiation of a different, generally longer wavelength than is being absorbed by the photosensitive components in the film. The absorbed energy is then transferred to the photosensitive amine and/or acid generator. Suitable photosensitizers for the amine generator used in the present invention include ketocoumarin, fluorenone, thioxanthone, anthraquinone, naphthiazoline, biacetyl and benzil and derivatives thereof. Suitable photosensitizers for the acid generator include perylene and substituted anthracene. Other useful photosensitizers will be known to those skilled in the art.

The process for generating a negative tone image of polyimide involves three steps. The first step involves coating the substrate with a film comprising a suitable polyamic alkyl ester and a photo base generator both dissolved in a suitable solvent. Suitable substrates are comprised of silicon, ceramics, polymer or the like. The film can be coated on the substrate using art known techniques such as spin or spray coating, or doctor blading. In the second step of the process, the film is imagewise exposed to radiation suitably at a wavelength of about 250-500 nm. Suitable radiation sources include mercury, mercury/xenon, and xenon lamps, x-ray or e-beam. The radiation is absorbed by the photosensitive base generator to produce free base in the exposed area. The free base catalyzes the imidization of the polyamic alkyl ester in the exposed area. Preferably, the film can then be heated to a low temperature of about 50° C. to 200° C. to facilitate the rapid imidization and insolubilization of the exposed areas. Some imidization of the unexposed area may occur without detriment provided the area remains soluble for the development step. The third step involves development of the image with a suitable solvent. Suitable solvents include polar solvents preferably aprotic polar solvents such as dimethyl formamide, N-methylpyrrolidone or mixtures thereof. The solvent can be admixed with polymer nonsolvents such as glyme or diglyme to further avoid any solvent absorption by the polyimide. After the film has been developed, it can optionally be fully imidized by heating to a high temperature (e.g. 350° C. or more). Optionally, prior to heating the film to an elevated temperature, it can be contacted with a base, neat or in solution, to further imidize the film thereby minimizing distortions which can occur during heating.

The processes for generating the positive tone image of polyimide on a substrate are generally similar to the negative tone image process. However, the film is either: (a) blanket exposed or heated to generate free amine or (b) heated to a temperature of about 50° C. to 250° C. to facilitate the activation of base catalysis of the imidization reaction. In each case, the free acid which is generated by the imagewise exposure, scavenges the free base in the imagewise exposed areas to prevent it from catalyzing the imidization of the polyamic alkyl ester. Thus, the imidization of polyamic alkyl ester only occurs in the unexposed areas of the film.

The present invention also relates to an integrated circuit such as multichip modules circuit chips or circuit boards made by the process of the present invention. A preferred integrated circuit comprises a circuit formed in an imaged polyimide film on a substrate by the steps of: (a) coating the substrate with a film comprising polyamic alkyl ester and a photobase generator; (b) imagewise exposing the film to radiation; (c) developing the image to generally expose the substrate and (d) forming the circuit in the developed film on the substrate by art known techniques. Generally, prior to forming the circuit, the patterned polyimide is heated to volatilize low molecular weight species.

After the substrate has been exposed, circuit patterns can be formed in the exposed areas by coating the substrate with a conductive material such as conductive metals by art known techniques such as evaporation, sputtering, plating, chemical vapor deposition or laser induced deposition. The surface of the film can be milled to remove any excess conductive material. Dielectric materials may also be deposited by similar means during the process of making circuits. Inorganic ions such as boron, phosphorous or arsenic can be implanted in the substrate in the process for making p or n doped circuit transitors. Other means for forming circuits are well known to those skilled in the art.

A preferred embodiment of the present invention relates to an integrated circuit packaging structure (multichip module) for providing signal and power current to a plurality of integrated circuit chips comprising: (i) a substrate having electrical connecting means for connection to a circuit board, ii) a plurality of alternating electrically insulating and conducting layers positioned on the substrate wherein at least of the conducting layers comprises a negative tone imaged polyimide film made by the process of the present invention and (iii) a plurality of vias for electrically interconnecting electrical connecting means, conducting layers and integrated circuit chips.

The integrated circuit packaging structure is an intermediate level of packaging between the integrated circuit chip and the circuit board. The integrated circuit chips are mounted on the integrated circuit packaging structure which is in turn mounted on the circuit board.

The substrate of the packaging structure is generally an inert substrate such as glass, silicon or ceramic. The substrate can optionally have integrated circuits disposed therein. The substrate is provided with electrical connecting means such as input/output pins (I/O pins) for electrically connecting the packaging structure to the circuit board. A plurality of electrically insulating and electrically conducting layers (layers having conductive circuits disposed in an insulating material) are alternatively stacked up on the substrate. The layers are generally formed on the substrate in a layer by layer process wherein each layer is formed in a separate process step. At least one of the conducting layers, comprises an integrated circuit formed in a negative tone imaged polyimide film formed by the process of the present invention.

The packaging structure also comprises receiving means for receiving the integrated circuit chips. Suitable receiving means include pinboards for receipt of chip I/O pins or metal pads for solder connection to the chip. Generally, the packaging structure also comprises a plurality of electrical vias generally vertically aligned to electrically interconnect the I/O pins, the conductive layers and integrated circuit chips disposed in the receiving means. The function, structure and method of manufacture of the integrated circuit packaging structure are well known to those skilled in the art as disclosed in U.S. Pat. Nos. 4,489,364; 4,508,981; 4,628,411 and 4,811,082, the disclosures of which are incorporated herein by reference.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention. All images are negative unless specified.

EXAMPLE 1

6.068 gm (0.0303 mole) of sublimed p,p'-oxydianiline and 4.80 gm (0.0607 mole) of dry, distilled pyridine, and 120 mL of freshly distilled N-methylpyrrolidone was charged into a 250 mL, three-necked flask equipped with mechanical stirrer, thermocouple well and argon bubbler. The polymerization mixture was stirred to produce a homogeneous solution and then cooled externally to ca. −5° C. At this point 13.90 gm (0.0300 mole) of meta-di(ethylglycolyl) pyromellitate diacyl chloride dissolved in ca. 25 mL of dry tetrahydrofuran was added dropwise so that the solution never exceeded 0° C. Once acyl chloride addition was complete, the polymerization mixture was allowed to reach ambient temperature and stirred for at least an additional 3 hours. The polymer was then isolated by precipitation in distilled water using a Waring blender. The lightly yellow colored powder was filtered and extracted twice more with distilled water, followed by methanol and finally ethyl acetate. The material was then dried in vacuo at 50° C. for 24 hours yielding 13.85 gm (96.9%) of poly (amic alkyl ester based on meta-di(ethylglycolyl) pyromellitate and p,p'-oxydianiline.

EXAMPLE 2

A formulation was prepared by dissolving 0.83 g of the poly(amic alkyl ester) of Example 1 along with 0.17 g of amine photogenerator 2-nitro α methyl benzyl cyclohexylcarbamate in N-methylpyrrolidone ("NMP"). The solution was applied to a silicon substrate by spincoating of a film >1.0 um thick followed by prebaking on a hot plate to remove solvent. The wafer was exposed through a mask to broadband irradiation of 250–310 nm light. Following irradiation, the substrate was heated to 100° C. for 10 minutes to facilitate imidization. Development by immersion in N-methylpyrrolidone resulted in negative images with resolution of 2 um features.

EXAMPLE 3

A solution was prepared by dissolving 0.72 g of the poly(amic alkyl ester) of Example 1 along with 0.15 g of 3,3'-carbonyl bis (7-methoxy ketocoumarin) and 0.13 g of 2-nitrobenzyl α methyl cyclohexylcarbamate in N-methylpyrrolidone. 1 $\mu$m films were prepared on substrate by spincoating of the solution followed by pre-baking on a hot plate to remove solvent. The films were exposed through a mask to 2.4 joules/cm$^2$ of 404 nm light followed by baking at 100° C. for 10 minutes. Development was done by immersion in N-methylpyrrolidone. Resolution of 4 $\mu$m features was evident on this film.

EXAMPLE 4

A solution was prepared by dissolving 0.83 g of the poly(amic alkyl ester) of Example 1 along with 0.17 g of photoamine generator n-cyclohexyl 1-(4,5-dimethoxy-2-nitrophenyl)-ethylcarbamate in N-methylpyrrolidone. 6.5 $\mu$m films were made by spin coating of the solution followed by pre-baking to remove solvent. Exposures were performed through a mask using broadband irradiation. The films were then heated on hot plate at 120° C. for 10 minutes. Development was done with 10% N-methylpyrrolidone in diglyme. Resolution of 8.0 $\mu$m features was made on the film.

EXAMPLE 5

A solution was prepared by dissolving 0.83 g of the poly(amic alkyl ester) derived from oxy-bis(trifluoroethyl phthalate) and p,p'oxydianiline along with 0.17 g of the photoamine generator of Example 2 in N-methylpyrrolidone. Films were prepared by spincoating of the solution followed by pre-baking to remove excess solvent. The films were exposed through a mask to broadband radiation and then baked at 120° C. for 10 minutes to facilitate imidization. Development was performed with 50% cyclohexanone in ethanol and resolution of 2.0 $\mu$m images was possible for 1.0$\mu$ thick films. The lithographic contrast for this system was 1.1.

EXAMPLE 6

A solution was prepared by dissolving of 2.0 g of the poly(amic alkyl ester) derived from para-diethyl pyromellitate and p,p'oxydianiline along with 0.1 g of photoamine generator of Example 2 in N-methylpyrrolidone. 4 $\mu$m thick films were prepared by spin coating of the solution followed by prebaking at 150° C. for 45 seconds to remove excess solvent. The films were exposed through a mask to a broadband mercury light source and then baked at 150° C. for 10 minutes. Development was done with 10% N-methylpyrrolidone in diglyme. Resolution of 5 $\mu$m features was achieved.

EXAMPLE 7

A formulation was prepared by dissolving 1 gm of the poly(amic alkyl ester) of Example 1 along with 0.15 gm of the photoamine generator of Ex. 4 and 0.1 gm of Ph$_3$SSbF$_6$ in NMP and spin coating on a substrate to form a film about 0.3 microns thick. The film was prebaked at 80° C. for one minute; flood exposed for 200 seconds at 365 nm and then imagewise exposed through a mask to broadband deep UV radiation. Following irradiation, the substrate was heated to 130° C. for 2 minutes and developed by immersion in NMP resulting in positive tone image.

EXAMPLE 8

A solution was prepared by dissolving 1.0 g of the poly(amic alkyl ester) derived from diethylbiphenyl tetracarboxylate and 1,4-phenylenediamine and 0.1 g of N-cyclohexyl 1-(4,5-dimethoxy-2-nitrophenyl)ethylcarbamate in 7.5 g of N-methylpyrrolidone. The filtered solution was applied to a silicon substrate by spin coating followed by baking a 80° C. for 10 minutes. Films with 4 micron thickness were obtained in this fashion. The films were then exposed through a mask to broadband irradiation from a mercury light source for 100 seconds. The exposure was followed by a bake at 150° C. for 10 minutes. Development was done by puddling 20% N-methylpyrrolidone in diglyme on the film for 1 minute and then spinning the film to dryness. Images with 3 micron film thickness were observed.

EXAMPLE 9

A solution was prepared by dissolving 0.81 g of poly-(amic alkylester) derived from diethyl pyromellitate and 2,2'-bis(trifluoromethyl)benzidine along with 0.08 g of N-cyclohexyl 1-(4,5-dimethoxy-2-nitrophenyl) ethylcarbamate in 4.6 g of N-methylpyrrolidone. The filtered solution was applied by spin coating to silicon substrates followed by baking at 80° C. for 10 minutes. Films with 2.5 micron film thickness were obtained in this fashion. The films were exposed through a mask to broadband irradiation from a mercury light source for 100 seconds. The films were then baked at 200° C. for 2.5 minutes and developed with 2% N-methylpyrrolidone in i-butylmethylketone. Images with 2.0 micron film thickness were observed.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A process for generating a negative tone image of polyimide on a substrate comprising the steps of: (a) coating the substrate with a film comprising polyamic alkyl ester and a photosensitive base generator; (b) imagewise exposing the film to radiation; and (c) developing the image.

2. The process of claim 1 wherein said polyimide is selected from poly(p-phenylene biphenyltetracarboximide), poly(p-oxydiphenylene pyromellitimide), poly [bis (trifluoromethyl biphenylene) pyromellitimide], poly [bis (trifluoromethyl biphenylene) biphenyltetracarboximide], poly (oxydiphenylene biphenyl tetracarboximide) poly (p-phenylene oxydiphthalimide) poly(hexafluoroisopropyldene diphenylene biphenyl tetracarboximide) or copolymers therof.

3. The process of claim 1 wherein the base generator is benzyl carbamate.

* * * * *